(12) United States Patent
Cooney, III et al.

(10) Patent No.: US 7,381,637 B2
(45) Date of Patent: Jun. 3, 2008

(54) METAL SPACER IN SINGLE AND DUAL DAMASCENCE PROCESSING

(75) Inventors: Edward C. Cooney, III, Jericho, VT (US); Robert M. Geffken, Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 11/053,706

(22) Filed: Feb. 8, 2005

(65) Prior Publication Data

US 2005/0146040 A1    Jul. 7, 2005

Related U.S. Application Data

(62) Division of application No. 10/186,814, filed on Jul. 1, 2002, now Pat. No. 6,888,251.

(51) Int. Cl.
*H01L 21/4763* (2006.01)
(52) U.S. Cl. ........................ 438/636; 438/622
(58) Field of Classification Search ................ 438/622, 438/636, 637
See application file for complete search history.

(56) References Cited

U.S. PATENT DOCUMENTS

| | | | |
|---|---|---|---|
| 5,126,006 A | | 6/1992 | Cronin et al. |
| 5,965,679 A | | 10/1999 | Godschalx et al. |
| 6,016,008 A | | 1/2000 | Feldner |
| 6,017,817 A | | 1/2000 | Chung et al. |
| 6,140,226 A | * | 10/2000 | Grill et al. .................. 438/637 |
| 6,368,967 B1 | | 4/2002 | Besser |
| 6,373,135 B1 | | 4/2002 | Weber |
| 6,509,267 B1 | * | 1/2003 | Woo et al. .................. 438/687 |
| 6,872,652 B2 | * | 3/2005 | Fang ........................... 438/623 |
| 2002/0081845 A1 | | 6/2002 | Lee et al. |

OTHER PUBLICATIONS

Semiconductor International; Low K Dielectrics: The Search Continues; Peter Singer; May 1996; pp. 88-96.
International Technology; Post ETCH Cleaning of Dual Damascene System Intergrating Copper and Silk TM; Louis et al.; May 1999; pp. 103-105.
Interconnect Technology; Copper-Silk Integration in a 0.18um Double Level Metal Interconnect; Demolliens et al.; May 1999; pp. 198-199.
Interconnect Technology; ETCH Process Development for Flare for Dual Damascene Architecture Using a N2/O2 Plasma; Thompson et al; May 1999; pp. 59-61.

(Continued)

*Primary Examiner*—Carl Whitehead, Jr.
*Assistant Examiner*—Candice Y Chan
(74) *Attorney, Agent, or Firm*—Gibb & Rahman, LLC

(57) ABSTRACT

A method and structure for a single or dual damascene interconnect structure comprises forming wiring lines in a metallization layer over a substrate, shaping a laminated insulator stack above the metallization layer, patterning a hardmask over the laminated insulator stack, forming troughs in the hardmask, patterning the laminated insulator stack, forming vias in the patterned laminated insulator stack, creating sidewall spacers in the bottom portion of the vias, depositing an anti-reflective coating on the sidewall spacers, etching the troughs, removing the anti-reflective coating, depositing a metal layer in the troughs, vias, and sidewall spacers, and applying conductive material in the troughs and the vias. The laminated insulator stack comprises a dielectric layer further comprising oxide and polyarylene.

17 Claims, 8 Drawing Sheets

OTHER PUBLICATIONS

Microwave Theory and Techniques; Advanced Silicon IC Interconnect Technology and Design: Present Trends and RF Wireless Implications; R.J. Gutmann; Jun. 1999; pp. 667-674.

Interconnect Technology Conference; Lithography as a Critical Step for Low-K Dual Damascene: From 248NM to 193 NM; Ronse et al; Jun. 2000; pp. 87-89.

Interconnect Technology; Copper Dual Damascene Integration Using Organic Low K Material: Construction Architecture Comparison; Morand et al; Jun. 2000; pp. 225-227.

Interconnect Technology Conference; Copper Dual Damascene Interconnects With Very Low-K Dielectrics Targeting for 130 NM Node; Kudo et al; Jun. 2000; pp. 270-272.

Interconnect Technology Conference; New Strategy to Improve the Mechanical Strength and to Reduce Potential Contamination of Dielectric Materials for Double Level Metal Integration; Assous et al; Jun. 2000; pp. 90-92.

Interconnect Technology Conference; A High Performance 0.13 UM Copper Beol Technology With Low-K Dielectric; Goldblatt et al; Jun. 2000; pp. 261-263.

* cited by examiner

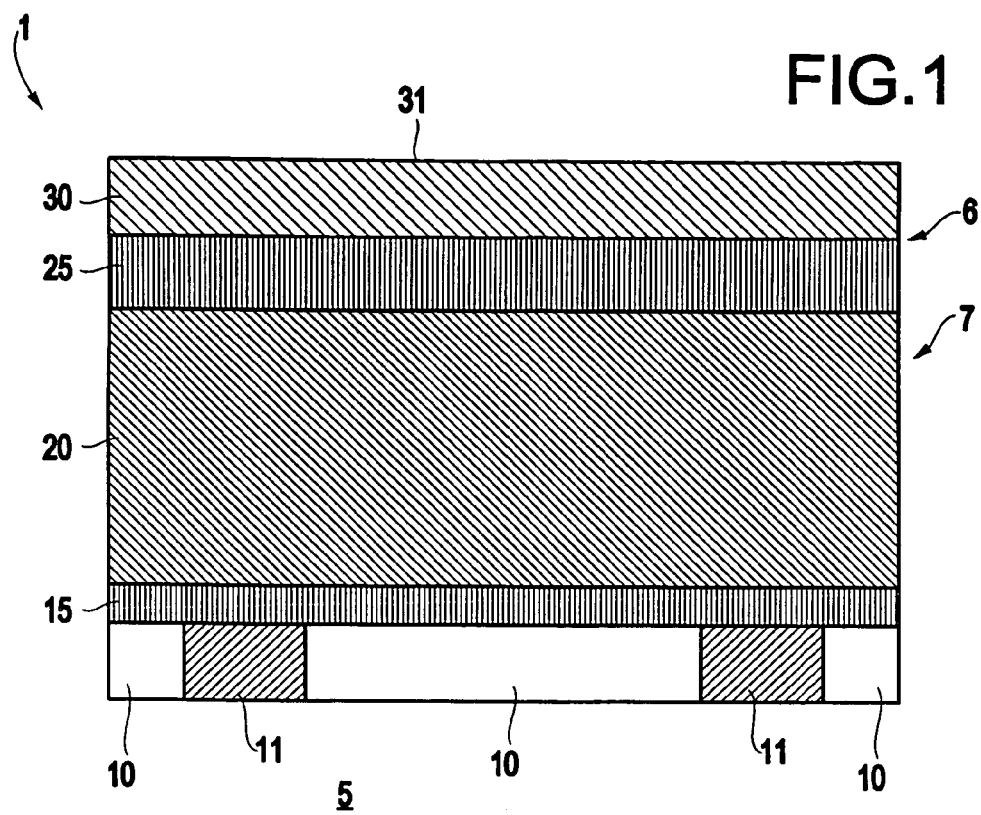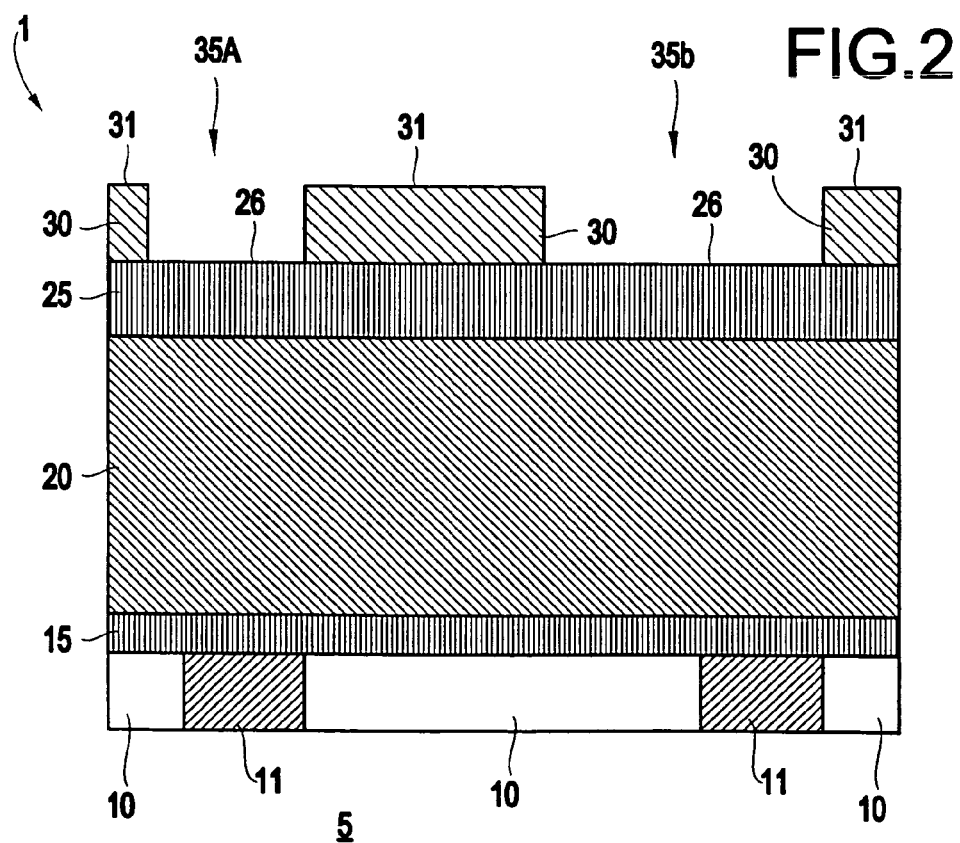

METAL SPACER IN SINGLE AND DUAL DAMASCENCE PROCESSING

CROSS-REFERENCE TO RELATED APPLICATIONS

This application is a division of U.S. application Ser. No. 10/186,814, filed on Jul. 1, 2002 now U.S. Pat. No. 6,888,251.

BACKGROUND OF THE INVENTION

1. Field of the Invention

The present invention generally relates to integrated circuit design, and more particularly to single and dual damascene fabrication using sacrificial metal spacers to aid in the fabrication process.

2. Description of the Related Art

Dual damascene processing in soft, non-silicon containing intermetal dielectrics, such as SiLK®, available from Dow Chemical Company, NY, USA, or FLARE®, available from Honeywell, NJ, USA (both materials are polyarylenes (PAE)) is extremely difficult at sub 0.25 micron dimensions because of etch bias, undercut corner erosion, etc., and other problems frequent during RIE processing. Additionally, the traditional argon sputter cleans resputtered PAE into the via bottom and onto the underlying metal (i.e. copper or tungsten) surface, resulting in degraded contact interface properties. Although only argon sputtering is given as an example, all methods of directional sputter cleaning, including reactive (i.e. hydrogen doped) methods are associated with these problems. PAE-type materials are much softer than oxides, and have much lower thermal conductivity, and are not oxygen or water diffusion barriers. Therefore, in general, they have much worse dielectric properties than oxide.

Conventional methods of performing a dual damascene process is through multiple photoresist mask and etch steps. Here, a single level photoresist profile is formed on a layer deposited dielectric and a via pattern is formed by etching to a first interlevel in the dielectric material. At this point in the process the via is only partially etched. The photoresist is then stripped and a second single layer photoresist profile is formed on the dielectric surface to form an interconnect pattern to a second interlevel in the dielectric material. The interconnect is then formed by etching. Coincident with etching the interconnect, the via is etched such that interconnects in underlying substrate layers are exposed to allow electrical contact. However, aligning the photoresist profiles is a problem using this method. For example, if the two photoresist profiles are not aligned correctly, then intersecting features in the dielectric material will be misaligned. That is, a conductive line associated with the first photoresist pattern may not correctly intersect a via associated with the second photoresist profile. These alignment errors can be corrected by making the intersecting features oversized, but this takes away from the overall goal of reducing the size of connecting lines and vias. Thus, alignment problems reduce yields, and increase cost and the complexity of integrated circuit processes.

The trench and via profiles are greatly affected during dual damascene processing, due to the poor etching selectivity between the photoresist and the low dielectric constant dielectrics (low k dielectrics) while oxygen plasma removes the photoresist layer. Moreover, the low k dielectrics fill the gaps between the wiring lines in order to prevent parasitic capacitance, which occurs when the distance between subsequent wiring lines is reduced. Thus, in order to avoid the problems associated with conventional dual damascene manufacturing techniques, complicated processes and structures are implemented.

Even proposed solutions to these rather complex processes, such as the process described in U.S. Pat. No. 6,017,817, issued to Chung, et. al., "Method of Fabricating Dual Damascene," the complete disclosure of which is herein incorporated by reference, does not provide an adequate solution to the problem of eliminating the PAE sputtering into the via bottom. Rather, these processes merely aim to reduce the effective capacitance of the low k dielectrics. In fact, these conventional techniques offer little, if any, solutions to such problems as etch bias and undercut corner erosion in the integrated circuit. Furthermore, the conventional processes do nothing to improve degraded contact interface properties due to the PAE sputtering into the via bottom.

Therefore, there is a need for a new and improved technique of dual damascene processing which overcomes the limitations of the conventional designs, and which improves the dual damascene process window, and/or eliminates the PAE sputtering into the via bottom by using a deep etch process.

SUMMARY OF THE INVENTION

In view of the foregoing and other problems, disadvantages, and drawbacks of the conventional dual damascene fabrication techniques the present invention has been devised, and it is an object of the present invention to provide a structure and method for a sacrificial metal spacer dual damascene fabrication technique. Another object of the present invention is to provide a new and improved technique of dual damascene processing which overcomes the limitations of the conventional designs. Still, another object of the present invention is to improve the dual damascene process window. Yet another object of the present invention is to eliminate the problem of PAE sputtering into the via bottom by using a deep etch process. It is still another object of the present invention to use metal spacers to aid in fabricating damascene wires/vias.

In order to attain the objects suggested above, there is provided, according to one aspect of the invention a dual damascene interconnect structure comprising a substrate, an insulator stack above the substrate, a hardmask over the insulator stack, patterned troughs defined into the hardmask, patterned vias defined into the insulator stack, wherein the vias comprise a top and bottom portion, sidewall spacers in the bottom portion of the vias, and a conductive layer covering the troughs and the vias. The insulator stack comprises a dielectric layer further comprising oxide and polyarylene. The sidewall spacers comprise conductive materials such as metal, and preferably tungsten. The dual damascene interconnect structure further comprises a metal layer, preferably copper, lining the troughs, the vias, and the sidewall spacers.

According to the present invention, the method of forming a dual damascene interconnect structure in a semiconductor substrate comprises first, forming an insulator stack above a substrate. Then, a hardmask is deposited over the insulator stack. Next, troughs are patterned into the hardmask. After this, vias are patterned into the insulator stack, wherein the vias comprise a top and bottom portion. Next, sidewall spacers are formed in the bottom portion of the vias. Upon completion of this step, the troughs are etched. Finally, a conductive layer is applied over the troughs and vias.

Alternatively, the method of forming a dual damascene interconnect structure in a semiconductor substrate comprises first forming a hardmask over a laminated insulator stack, wherein the laminated insulator stack is formed above a substrate. Next, troughs are created in the hardmask. After this, vias are formed in the laminated insulator stack. Then, a conductive (or semiconductive or insulative) layer is deposited in the vias. The next step is to pattern the conductive (or semiconductive or insulative) layer to create sidewall spacers in the vias, wherein if conductive material is used, then the conductive material comprises metal. Then, an anti-reflective coating is deposited on the sidewall spacers. Upon completion of this step, the troughs are etched. After this, the anti-reflective coating is removed. Then, a metal layer is deposited in the troughs, vias, and sidewall spacers, and finally, conductive material is applied in the troughs and vias. Still alternatively, the process of first etching the troughs and then the vias may be reversed, wherein the vias are first defined into the hardmask followed by the troughs.

There are several benefits of the present invention. For example, the present invention provides a novel structure and method for forming a sacrificial metal spacer dual damascene structure. Also, the present invention provides a new and improved technique of dual damascene processing which overcomes the limitations of the conventional designs. Additionally, the present invention improves the dual damascene process window. Furthermore, the present invention eliminates the problem of PAE sputtering into the via bottom by using a deep etch process. Finally, the present invention uses metal (tungsten) spacers to aid in fabricating damascene wires/vias.

BRIEF DESCRIPTION OF THE DRAWINGS

The foregoing and other objects, aspects and advantages will be better understood from the following detailed description of the preferred embodiments of the invention with reference to the drawings, in which:

FIG. 1 is a schematic diagram of a partially completed integrated circuit according to the present invention;

FIG. 2 is a schematic diagram of a partially completed integrated circuit according to the present invention;

DETAILED DESCRIPTION OF PREFERRED EMBODIMENTS OF THE INVENTION

Figure 3:
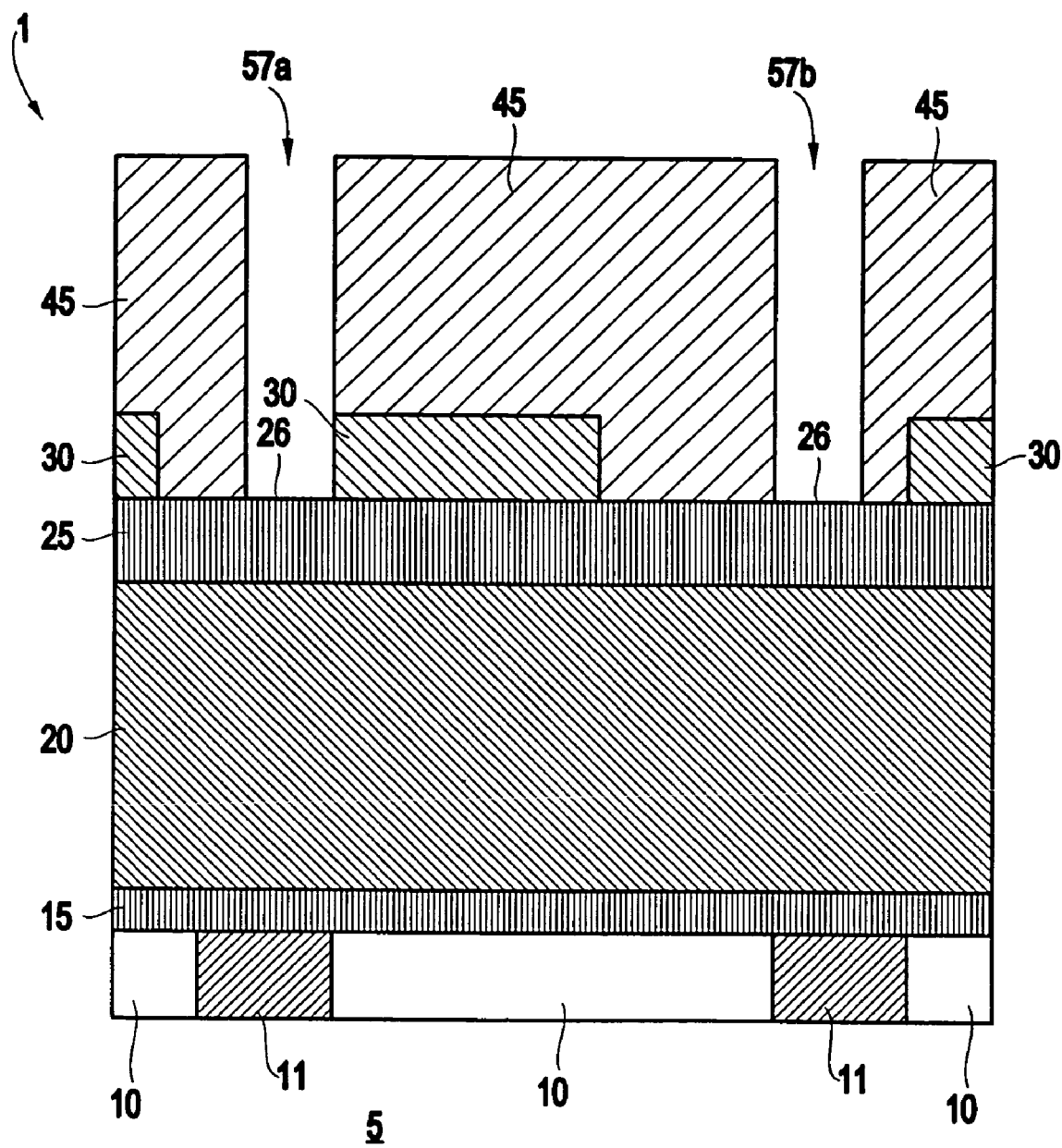
FIG. 3 is a schematic diagram of a partially completed integrated circuit according to the present invention.

As mentioned there is a need for a new and improved technique of dual damascene processing which overcomes the limitations of the conventional designs, and which improves the dual damascene process window, and/or eliminates the PAE sputtering into the via bottom by using a deep etch process. Furthermore, the argon sputter cleaning process commonly used prior to the metal liner deposition in the dual damascene trough/via can sputter PAE into the via hole resulting in a degraded via to underlying wire interface. Thus, the present invention solves this problem by fabricating the via bottom to the underlying interface prior to the trough etch. Because the argon sputter cleaning process does not sputter any exposed PAE surfaces or corners, there is reduced or no PAE resputtered into the via bottom. Therefore, according to the present invention metal spacers are used to aid in fabricating damascene wires/vias.

Referring now to the drawings, and more particularly to FIGS. 1-13, there are shown preferred embodiments of the method and structures according to the present invention. More specifically, FIG. 1 shows a partially completed integrated circuit device 1 comprising a plurality of insulator layers 7 stacked on a substrate 5. Next, a metallization layer 10 is deposited over the substrate 5. The metallization layer 10 comprises wiring conductors 11 therein. The wiring conductors are preferably comprised of copper. Above the metallization layer 10 and wiring conductors 11 is a first nitride insulating barrier layer 15. Above the first nitride layer 15 is a layer 20 of low dielectric constant material, such as SiLK®, FLARE®, and traditional materials such as silicon dioxide and fluorinated silicon dioxide (FSG), and microporous glasses such as Nanoglass®, available from Honeywell, Inc., NJ, USA, as well as Black Diamond, available from Applied Material, CA, USA; Coral, available from Novellus Systems, Inc., CA, USA; and Xerogel, available from Allied Signal, NJ, USA. Next, above the low-k layer 20 is a second nitride insulating barrier layer 25. Finally, a cap insulating oxide layer 30 having an upper surface 31 is shown above the second nitride layer 25. The oxide layer 30 and the second nitride layer 25 together comprise a hardmask 6.

FIG. 2 shows the partially completed integrated circuit device 1 in the next phase of processing. Here, the upper cap oxide layer 30 is patterned using conventional processing techniques, which are well known in the art, thereby forming troughs 35a, 35b. The patterning process exposes the upper surfaces 26 of the second nitride layer 25.

FIG. 3 illustrates the integrated circuit device 1 in its next phase of processing, wherein a via photoresist layer 45 is selectively etched over the oxide layer 30. Vias 57a, 57b remain after the etching is complete. Moreover, vias 57a, 57b expose a portion of the upper surface 26 of the second nitride layer 25. Additionally, in the left hand side via 57a, a portion of a side of the second nitride layer 25 is also exposed after the patterning. In the left side via 57a, the subsequent traditional argon sputter cleaning processes resputter PAE into the via 57a bottom and onto the underlying metal (i.e. copper or tungsten) surface 12, resulting in degraded contact interface properties. Here, the left side is simply a smaller or different dimension damascene feature (trough) that is being defined, compared to the right side.

Figure 4:
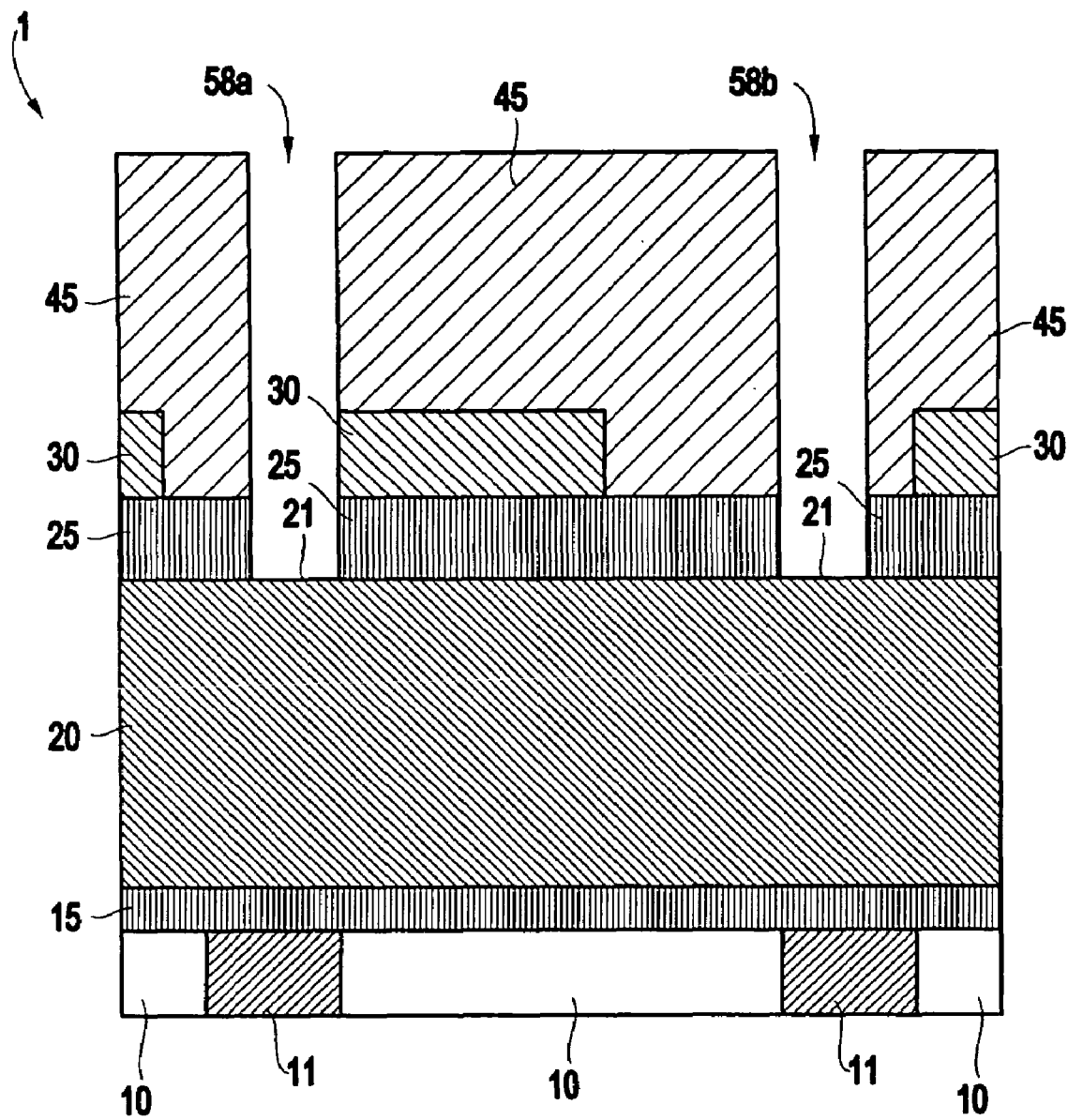
FIG. 4 is a schematic diagram of a partially completed integrated circuit according to the present invention.

Next, as shown in FIG. 4, the via photoresist layer 45 is further etched and vias 58a, 58b are formed. That is, the patterning occurs in patterned vias 57a, 57b and here the exposed portions of the upper surface 26 of the second nitride layer 25 are patterned, thereby resulting in a patterned vias 58a, 58b (vias 57a, 57b become vias 58a,b, 59a,b, 60a,b, 61a,b, 62a,b, 63a,b, and 64a,b, respectively, in the subsequent patterning processes to follow). Patterned vias 58a, 58b expose a portion of the upper surface 21 of the layer 20 of low dielectric constant material.

Figure 5:
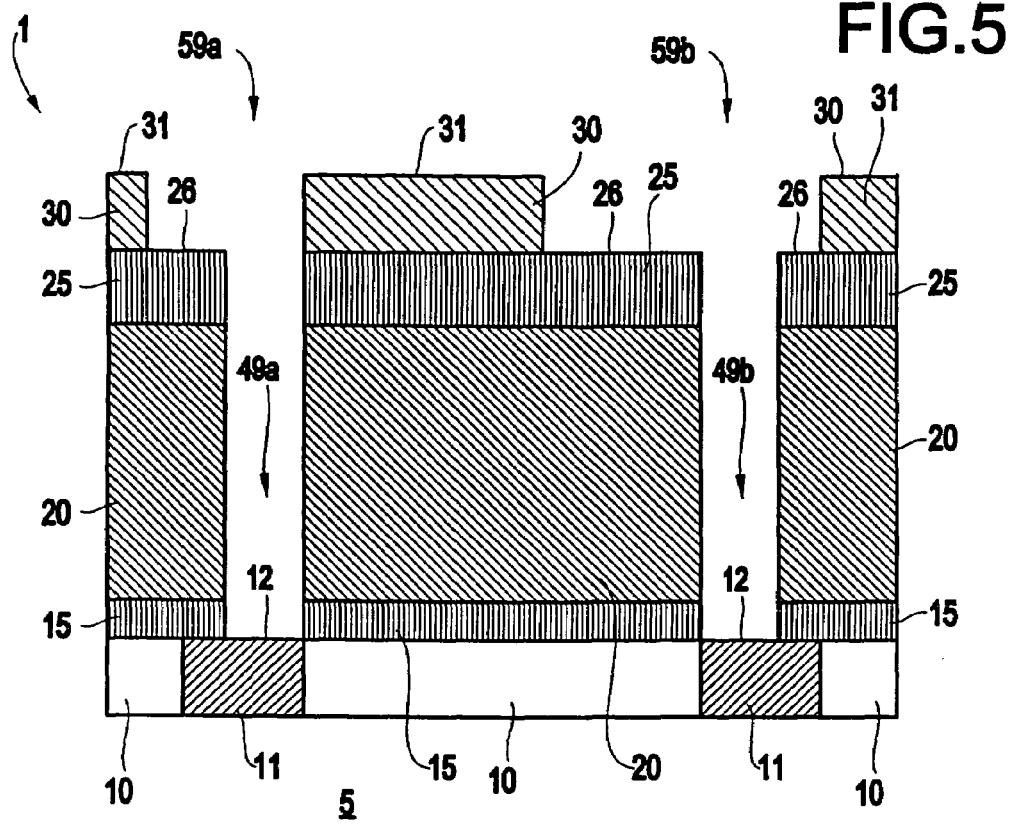
FIG. 5 is a schematic diagram of a partially completed integrated circuit according to the present invention.

In FIG. 5, a further patterning process occurs, whereby patterned regions 58a, 58b are further etched through the second nitride layer 25, the layer 20 of the low dielectric constant material, and the first nitride layer 15, thereby creating trenches 49a, 49b in patterned vias 59a, 59b. Also, the via photoresist layer 45 is removed, and the upper surface 31 of the oxide layer 30 is exposed, as well as portions 26 of the second nitride layer 25, and portions of the upper surface 12 of the wiring conductors 11.

Figure 6:
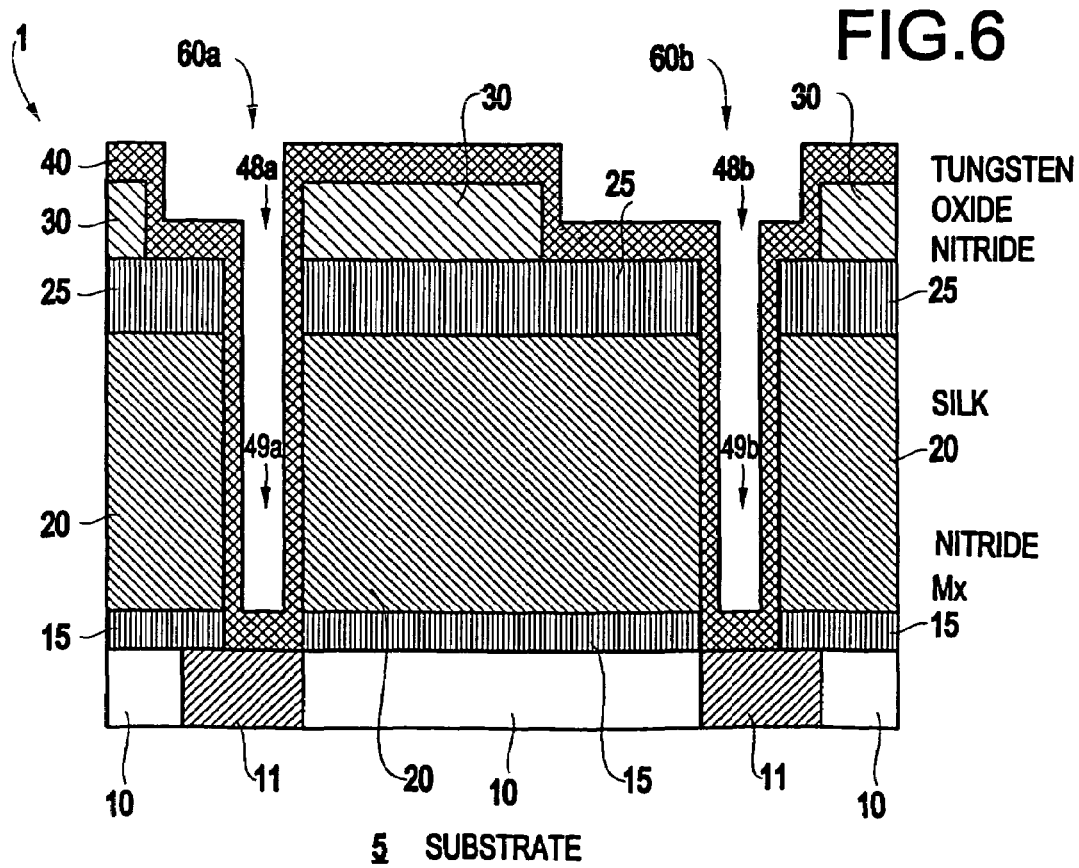
FIG. 6 is a schematic diagram of a partially completed integrated circuit according to the present invention.

In FIG. 6, it is illustrated that a conductive layer 40, preferably tungsten, is deposited uniformly above the oxide layer 30 and into the trenches 49a, 49b of vias 60a, 60b. The conductors being installed into the via (layer 40) are typically tantalum nitride, although tantalum or bilayers of tantalum-nitride followed by tantalum may also be used. Other metals such as tungsten or tantalum-silicon-nitride, titanium nitride, etc., could also be used. Alternatively, non-conductive materials could also be used as the purpose of this layer 40 is to form a barrier between the copper and dielectric and additionally, a good adhesion to the copper and dielectric is needed as well. Thus, semiconductors, such as aluminum oxide, or even insulators could be used to fulfill this role.

Figure 7:
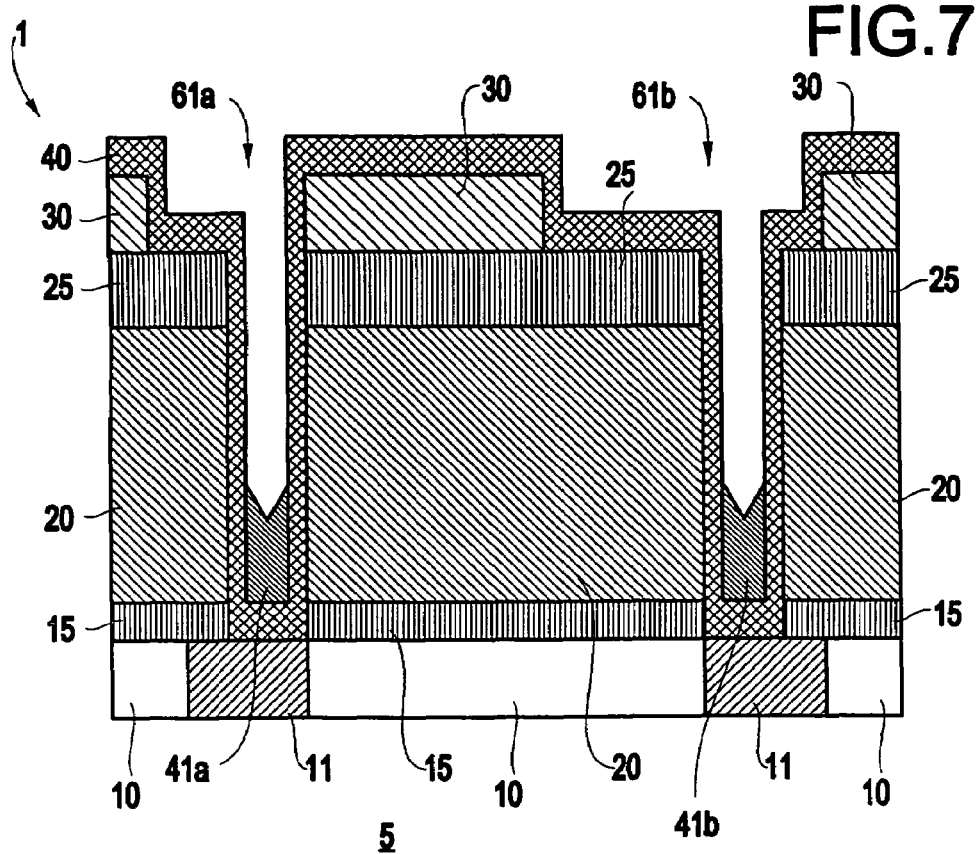
FIG. 7 is a schematic diagram of a partially completed integrated circuit according to the present invention.
Figure 8:
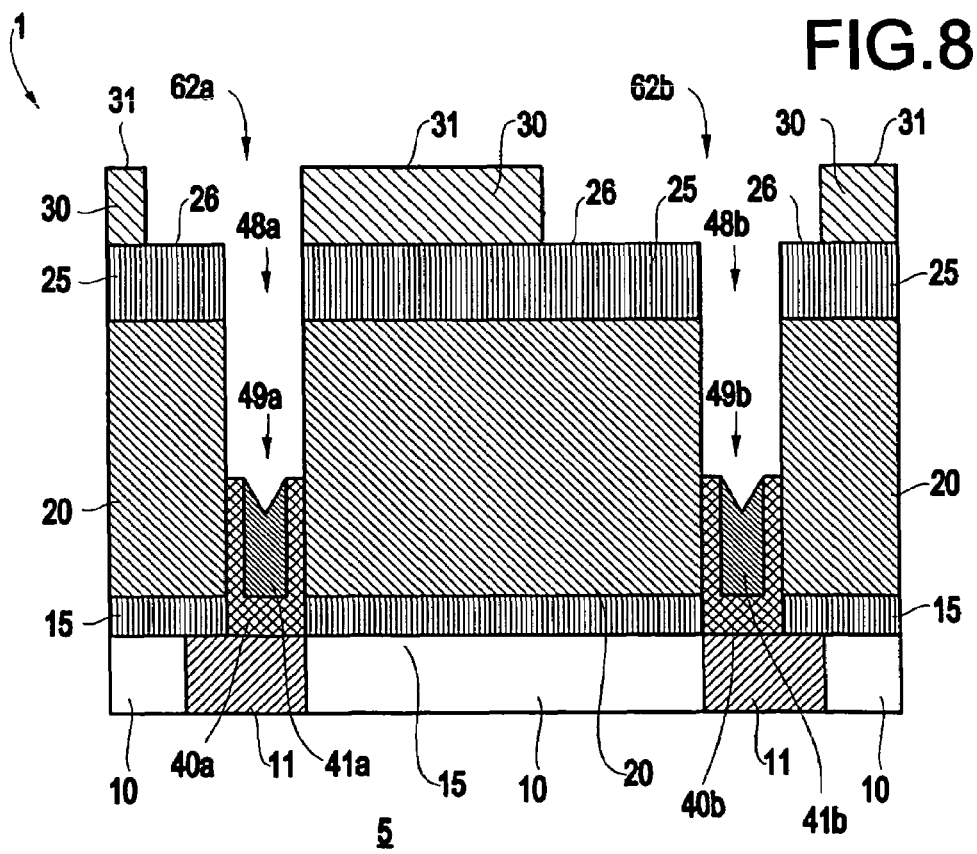
FIG. 8 is a schematic diagram of a partially completed integrated circuit according to the present invention.

Next, as best seen in FIG. 7, a layer of anti-reflective coating (ARC®) 41a, 41b, such as DUV-30 ARC® (deep ultraviolet anti-reflective coating), available from Brewer Science, MO, USA, is deposited in the trenches 49a, 49b of vias 61a, 61b and is selectively etched. In FIG. 8, it is shown that the conductive layer 40 is selectively etched thereby resulting in etched sidewall spacers 40a, 40b adjacent to the lower sidewalls of the low-k surfaces 20 within the trenches 49a, 49b of vias 62a, 62b. Here, the etching results in exposing portions of the upper surface 26 of the second nitride layer 25, and portions of the upper surface 31 of the upper cap oxide layer 30. The etching further patterns the sidewall spacers 41a, 41b to the level of the anti-reflective coating 41a, 41b within the trenches 49a, 49b of vias 62a, 62b, respectively.

Figure 9:
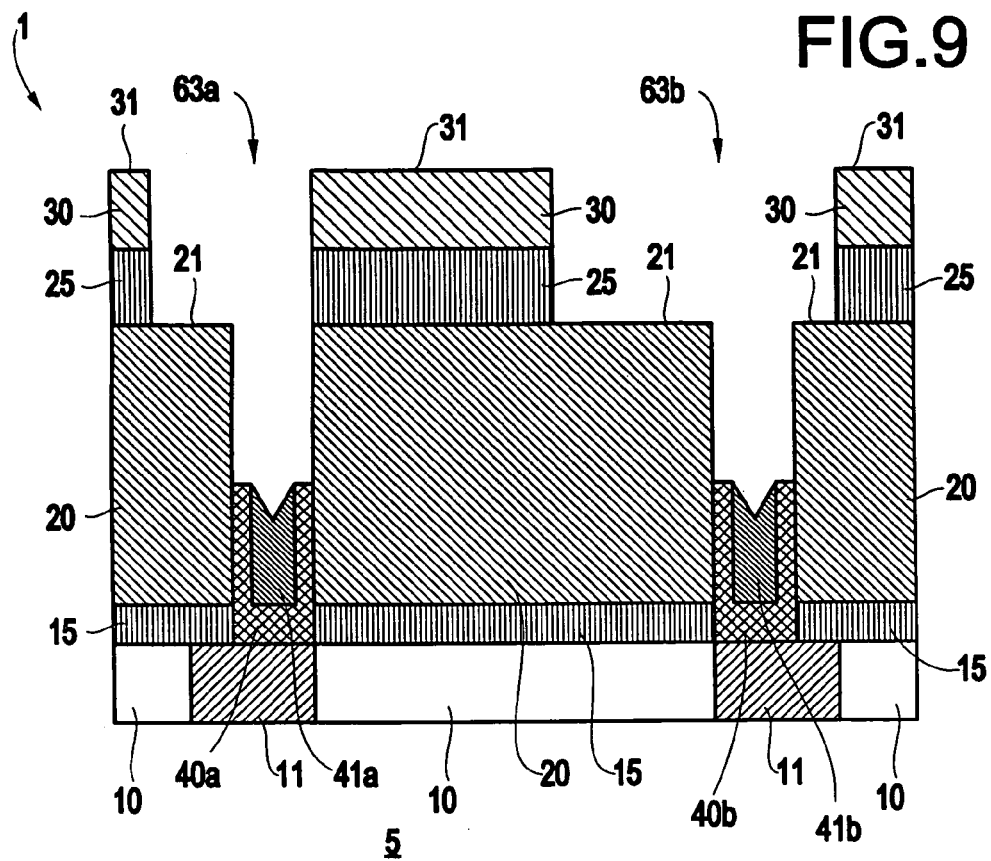
FIG. 9 is a schematic diagram of a partially completed integrated circuit according to the present invention.

Next, in FIG. 9 the device 1 undergoes an additional patterning step, wherein vias 63a, 63b are created by removing the exposed portions of the upper surface 26 of the second nitride layer 25. This patterning step results in exposed surfaces 21 of the low dielectric constant material layer 20.

Figure 10:
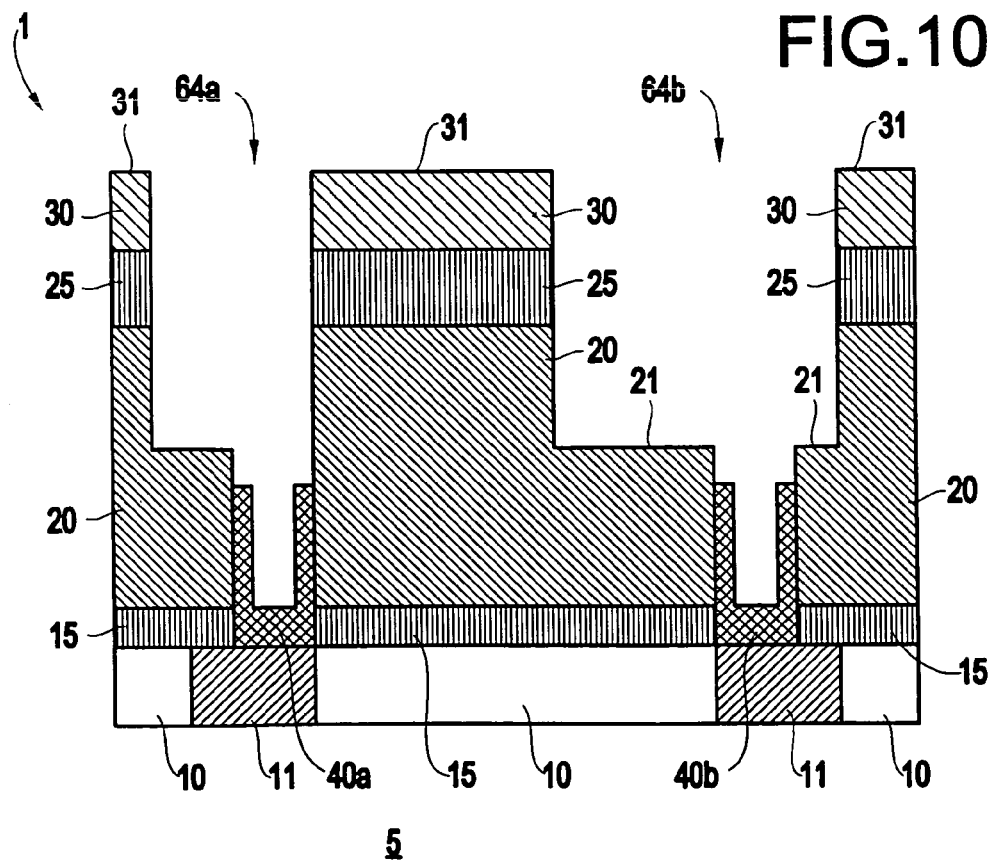
FIG. 10 is a schematic diagram of a partially completed integrated circuit according to the present invention.

FIG. 10 illustrates the next step of the process of forming the integrated circuit device 1. Here, the device 1 is further patterned by removing the anti-reflective coating 41a, 41b and additional portions of the low-k layer 20, thereby creating vias 64a, 64b. Moreover, the patterning results in exposing a lower level of the upper surface 21.

Figure 11:
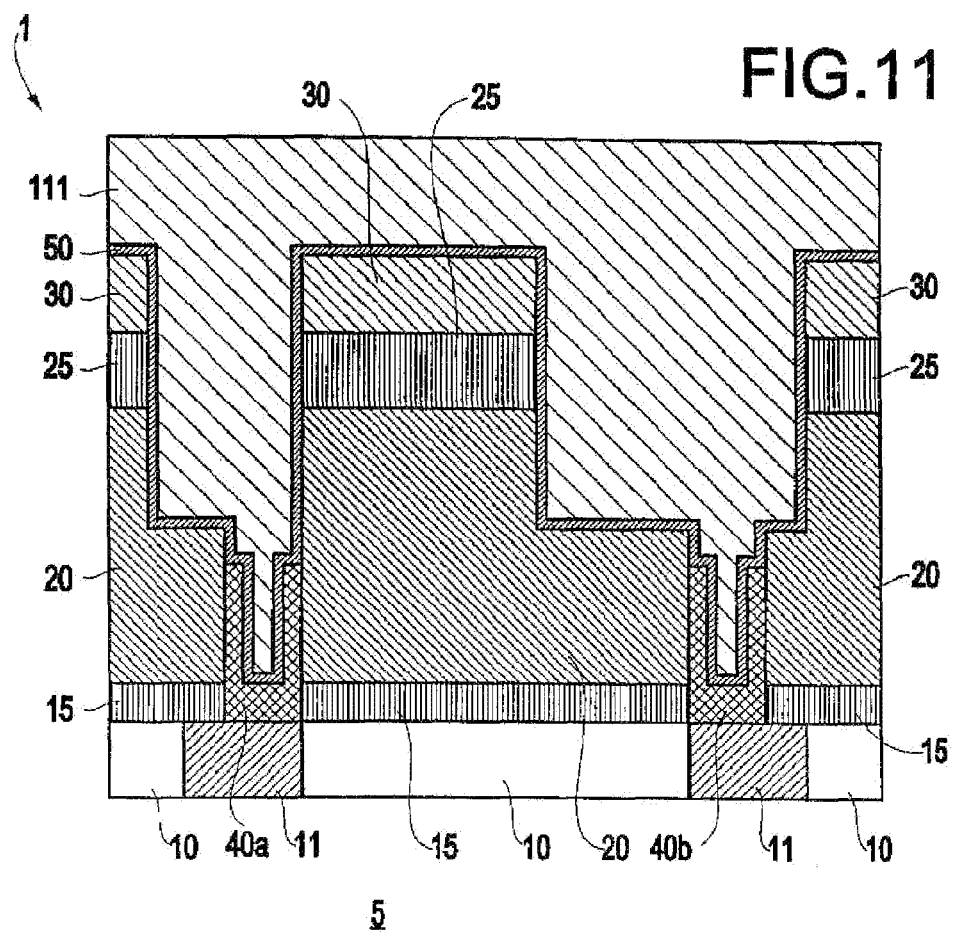
FIG. 11 is a schematic diagram of a partially completed integrated circuit according to the present invention.

Next, as shown in FIG. 11, the patterned vias 64a, 64b are filled with a copper liner 50 above the second nitride layer 30, the exposed portions 21 of the low-k material 20, and in the trenches 49a, 49b. Additionally, a liner or barrier material (not shown) is deposited immediately prior to the copper nucleation layer and subsequent copper fill material. Then, the vias 64a, 64b are filled with a metal material, preferably copper, to create conductors 111, which comprises the same material as used to create the wiring conductors 11. Moreover, the metal material is deposited over the entire device 1 to create a temporary conductive cap layer 111.

Figure 12:
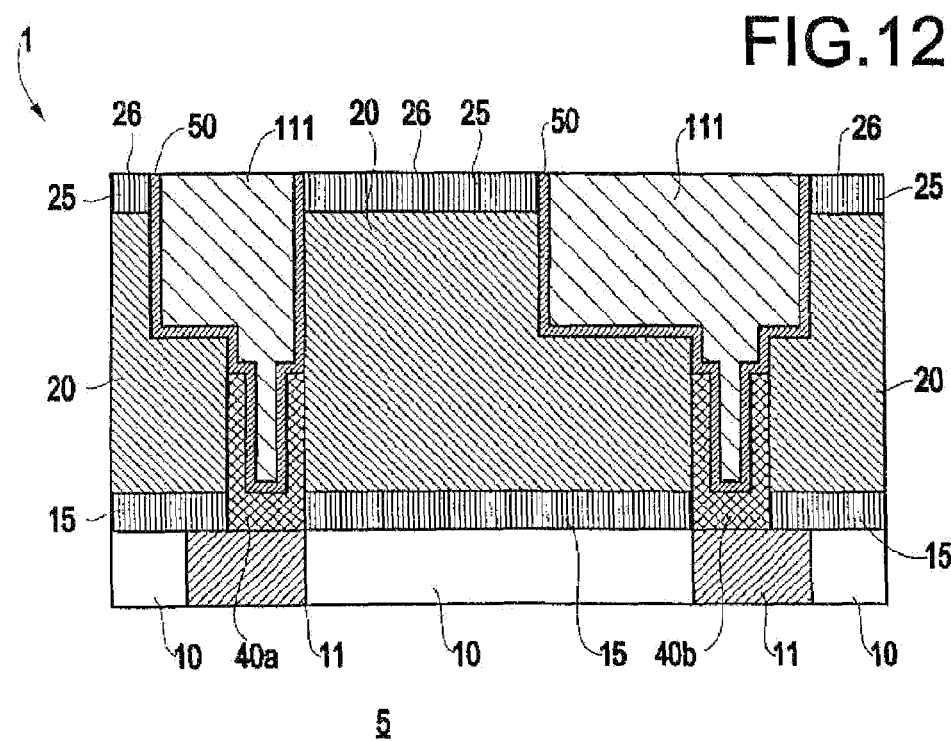
FIG. 12 is a schematic diagram of a completed integrated circuit according to the present invention.

FIG. 12 illustrates the final step in the process wherein the device 1 is planarized, thus removing the oxide layer 30 and the portion of the upper temporary conductive cap layer 111 above the second nitride layer 25. The completed planarized device 1 comprises the metallization layer 10 over the substrate 5. The metallization layer 10 comprises wiring conductors 11 therein. Above the metallization layer 10 and wiring conductors 11 is the first nitride insulating barrier layer 15. Above the first nitride layer 15 is the layer 20 of low dielectric constant material, such as SiLK®. Next, above the low-k layer 20 is the second nitride insulating barrier layer 25. The conductors 11 do not extend through the low-k layer 20 up through the upper surface 26 of the device 1. Rather, the sidewall spacers 40a, 40b separates the lower wiring conductors 11 in the metallization layer 10 from the upper conductors 111 in the insulative stack 7. Moreover, the metal spacers 40a, 40b are separated from the upper conductors 111 by the copper liner 50.

Figure 13:
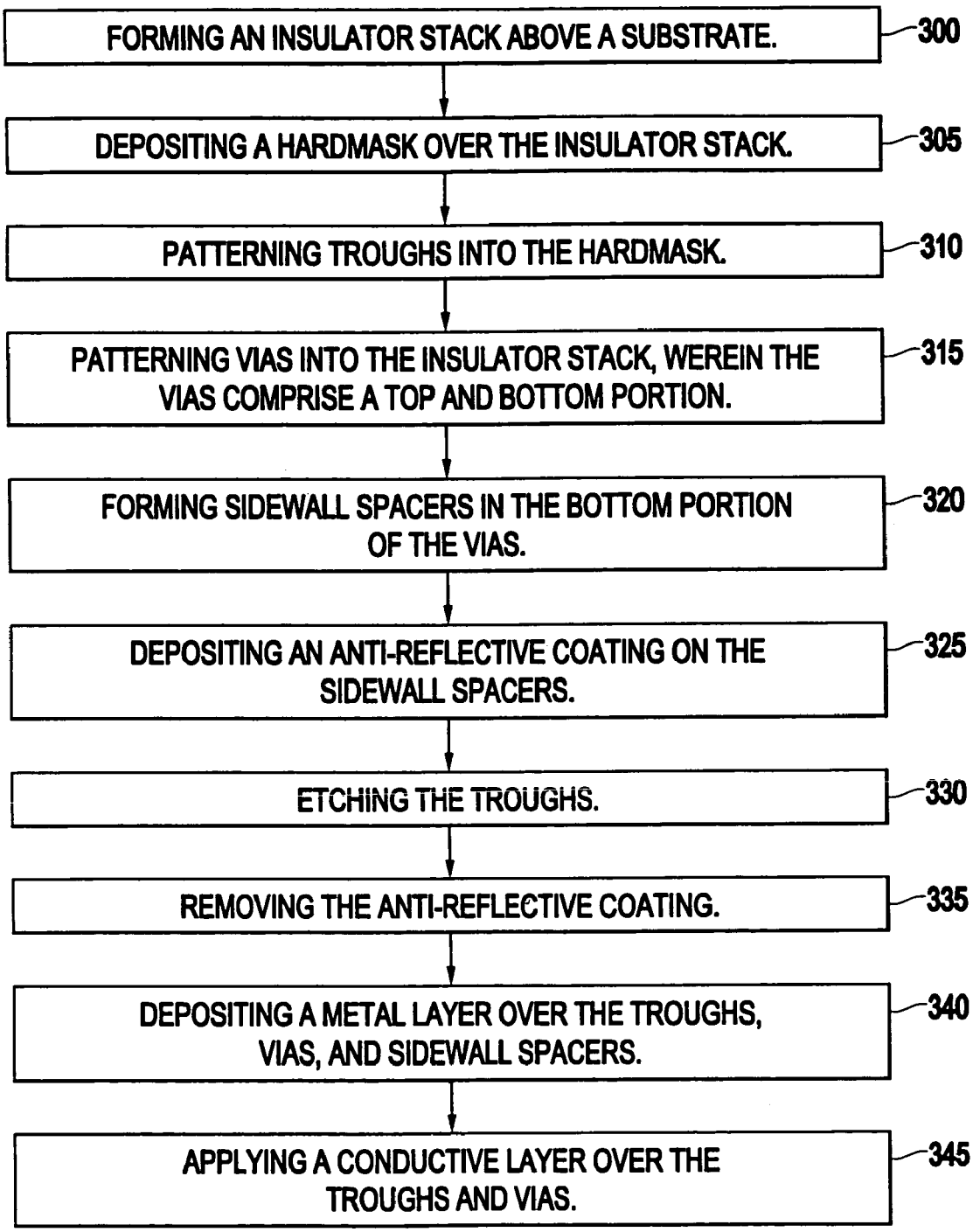
FIG. 13 is a flow diagram illustrating a preferred method of the invention.

FIG. 13 illustrates a flow diagram of the entire process of forming a dual damascene interconnect in a semiconductor substrate 5. The method comprises first forming 300 an insulator stack 7 above a substrate 5. Then, a hardmask 6 is deposited 305 over the insulator stack 7. Next, troughs 35a, 35b are patterned 310 into the hardmask 6. The next step in the process is patterning 315 vias 59a, 59b into the insulator stack 7, wherein the vias 59a, 59b comprise a top portion 48a, 48b and bottom portion 49a, 49b. Upon completion of this step, sidewall spacers 40a, 40b are formed 320 in the bottom portion 49a, 49b of the vias 59a, 59b. Then, an anti-reflective coating 41a, 41b is deposited 325 on the sidewall spacers 40a, 40b. Next, the troughs 35a, 35b are etched 330. After this, the anti-reflective coating 41a, 41b is removed 335. The next step is depositing 340 a metal layer 50 over the troughs 35a, 35b, vias 64a, 64b, and sidewall spacers 40a, 40b. Finally, a conductive layer 111 is applied 345 over the troughs 35a, 35b and vias 64a, 64b.

There are several benefits of the present invention. For example, the present invention provides a novel structure and method for forming a sacrificial metal spacer dual damascene structure. Also, the present invention provides a new and improved technique of dual damascene processing which overcomes the limitations of the conventional designs. Additionally, the present invention improves the dual damascene process window. Furthermore, the present invention eliminates the problem of PAE sputtering into the via bottom by using a deep etch process. Finally, the present invention uses metal (tungsten) spacers to aid in fabricating damascene wires/vias.

The sidewall spacers 40a, 40b are advantageous because the argon sputter clean commonly used prior to the metal liner deposition in the dual damascene trough/via can sputter PAE into the via hole (from the sidewalls). This results in a degraded via interface where it contacts the previous metallization layer of copper or tungsten. Thus, the sidewall spacers 40a, 40b overcome this problem. The reason the interface becomes degraded is that the sputtering of PAE into this location will cause a mix of PAE and metal at the interface and thus weaken it. Moreover, the interface will be physically inconsistent as both PAE and metal would be present which can result in poor contact and/or bonding, thus limiting electrical contact area and even mechanical adhesion area. Basically, the present invention solves the issue of the sputter preclean sputtering PAE to this location by first fabricating the via bottom to the underlying interface prior to the trough etch, and thus, there is no exposed PAE in the lower via area, which will negate PAE sputter to the interface.

No conventional processes utilize the spacer methodology taught by the present invention, because prior to the present invention, no conventional solution has attempted to integrate true low k (PAE type) materials into semiconductors, much less presenting a method or structure to prevent PAE resputtering.

While the invention has been described in terms of preferred embodiments, those skilled in the art will recognize that the invention can be practiced with modification within the spirit and scope of the appended claims.

What is claimed is:

1. A method of forming an interconnect in a semiconductor substrate, said method comprising:
   forming an insulator stack above a substrate;
   depositing a hardmask over said insulator stack;
   patterning troughs into said hardmask;
   depositing a photoresist layer over said troughs;
   patterning vias in said photoresist layer such that said vias are positioned within said troughs;
   etching said vias through said insulator stack, wherein said vias comprise a top portion, a bottom portion, sidewalls and a bottom surface;
   forming a first conductive layer only in said bottom portion of said vias adjacent said sidewalls and said bottom surface;
   after said forming of said first conductive layer in said bottom portion, etching said troughs into said insulator stack;
   applying a second conductive layer over said troughs and said vias such that said second conductive layer is separated from said bottom surface by said first conductive layer;
   depositing said first conductive layer such that said first conductive layer lines said top portion and said bottom portion of said vias;
   depositing an anti reflective coating on said first conductive layer;
   recessing said anti reflective coating such that said anti reflective coating is positioned only within said bottom portion of said vias; and
   removing exposed portions of said first conductive layer.

2. The method of claim 1, all the limitations of which are incorporated herein by reference, wherein said insulator stack is formed to include oxide.

3. The method of claim 1, all the limitations of which are incorporated herein by reference, wherein said insulator stack is formed to include a dielectric layer further comprising polyarylene.

4. The method of claim 1, all the limitations of which are incorporated herein by reference, wherein said first conductive layer comprises one of tungsten, tantalum, titanium and an alloy of one of tungsten, tantalum and titanium.

5. The method of claim 1, all the limitations of which are incorporated herein by reference, further comprising, before said applying of said second conductive layer over said troughs and said vias, forming a metal liner in said troughs and said vias such that said second conductive layer is separated from said first conductive layer by said metal liner.

6. The method of claim 3, all the limitations of which are incorporated herein by reference, further comprising before said applying of said second conductive layer, performing a sputter cleaning process, wherein said sputter cleaning process causes polyarylene resputter from said dielectric layer and wherein said first conductive layer protects said bottom surface from said polyarylene resputter.

7. The method of claim 1, all the limitations of which are incorporated herein by reference, further comprising removing said anti reflective coating prior to said step of applying.

8. A method of forming an interconnect, said method comprising:
   forming a wiring conductor above a substrate;
   forming an insulator stack above said wiring conductor;
   depositing a hardmask over said insulator stack;
   patterning a trough into said hardmask;
   depositing a photoresist layer over said trough;
   patterning a via in said photoresist layer such that said via is positioned within said trough;
   etching said via through said insulator stack, wherein said via comprises a top portion, a bottom portion, sidewalls and a bottom surface and wherein said wiring conductor is exposed at said bottom surface of said via;
   forming a first conductive layer only in said bottom portion of said via adjacent said sidewalls and said bottom surface;
   after said forming of said first conductive layer in said bottom portion, etching said trough into said insulator stack;
   applying a second conductive layer over said trough and said via such that said second conductive layer is separated from said wiring conductor at said bottom surface of said via by said first conductive layer;
   depositing said first conductive layer such that said first conductive layer lines said via;
   depositing an anti reflective coating on said first conductive layer;
   recessing said anti reflective coating such that said anti reflective coating is only in said bottom portion of said via; and
   removing exposed portions of said first conductive layer.

9. The method of claim 8, all the limitations of which are incorporated herein by reference, wherein said insulator stack is formed to include oxide.

10. The method of claim 8, all the limitations of which are incorporated herein by reference, wherein said insulator stack is formed to include a dielectric layer further comprising polyarylene.

11. The method of claim 10, all the limitations of which are incorporated herein by reference, further comprising, before said applying of said second conductive layer, performing a sputter cleaning process, wherein said sputter cleaning process causes polyarylene resputter from said dielectric layer and wherein said first conductive layer protects said metal conductor from said polyarylene resputter.

12. The method of claim 8, all the limitations of which are incorporated herein by reference, wherein said first conductive layer comprises one of tungsten, tantalum, titanium and an alloy of one of tungsten, tantalum and titanium.

13. The method of claim 8, all the limitations of which are incorporated herein by reference, further comprising, before said applying of said second conductive layer over said trough and said via, forming a metal liner in said trough and said via such that said second conductive layer is separated from said first conductive layer by said metal liner.

14. The method of claim 8, all the limitations of which are incorporated herein by reference, further comprising removing said anti reflective coating prior to said step of applying.

15. A method of forming an interconnect, said method comprising:

forming a wiring conductor above a substrate;

forming an insulator stack above said wiring conductor, wherein said insulator stack comprises a low-k dielectric layer comprising polyarylene;

depositing a hardmask over said insulator stack;

patterning a trough into said hardmask;

depositing a photoresist layer over said trough;

patterning a via in said photoresist layer such that said via is positioned within said trough;

etching said via through said insulator stack, wherein said via comprises a top portion, a bottom portion, sidewalls and a bottom surface and wherein said wiring conductor is exposed at said bottom surface of said via;

forming a first conductive layer only in said bottom portion of said via adjacent said sidewalls and said bottom surface;

after said forming of said first conductive layer in said bottom portion, etching said trough into said insulator stack;

performing a sputter cleaning process, wherein said sputter cleaning process causes polyarylene resputter from said low-k dielectric layer;

applying a second conductive layer different from said first conductive layer over said trough and said via such that said second conductive layer is separated from said wiring conductor at said bottom surface of said via by said first conductive layer, wherein said first conductive layer protects said metal conductor from said polyarylene resputter and prevents degradation of the interface between said metal conductor and said second conductive layer;

depositing said first conductive layer such that said first conductive layer lines said via;

depositing an anti reflective coating on said first conductive layer;

recessing said anti reflective coating such that said anti reflective coating is only in said bottom portion of said via; and removing exposed portions of said first conductive layer; and removing said anti reflective coating prior to said step of applying.

16. The method of claim 15, all the limitations of which are incorporated herein by reference, wherein said first conductive layer comprises one of tungsten, tantalum, titanium and an alloy of one of tungsten, tantalum and titanium and said second conductive layer comprises copper.

17. The method of claim 15, all the limitations of which are incorporated herein by reference, further comprising, before said applying of said second conductive layer over said trough and said via, forming a copper liner in said trough and said via such that said second conductive layer is separated from said first conductive layer by said copper liner.

* * * * *